(12) United States Patent
Sakata

(10) Patent No.: US 7,189,918 B2
(45) Date of Patent: Mar. 13, 2007

(54) ELECTRONIC CONTROL UNIT

(75) Inventor: Takeshi Sakata, Maebashi (JP)

(73) Assignees: NSK Ltd., Tokyo (JP); NSK Steering Systems Co., Ltd., Tokyo (JP)

( * ) Notice: Subject to any disclaimer, the term of this patent is extended or adjusted under 35 U.S.C. 154(b) by 0 days.

(21) Appl. No.: 10/976,176

(22) Filed: Oct. 29, 2004

(65) Prior Publication Data
US 2005/0115727 A1     Jun. 2, 2005

(30) Foreign Application Priority Data
Oct. 29, 2003 (JP) ............... 2003-368565

(51) Int. Cl.
*H05K 5/00* (2006.01)
*F02D 1/00* (2006.01)

(52) U.S. Cl. ............ 174/17 VA; 174/50; 174/520; 439/76.1; 439/76.2; 361/600

(58) Field of Classification Search .......... 174/50, 174/17 VA, 17 R, 52.1, 52.4; 439/76.1, 439/76.2, 949; 361/600, 601, 676, 679, 687, 361/688, 692, 694; 454/275, 184, 254
See application file for complete search history.

(56) References Cited

U.S. PATENT DOCUMENTS 5,649,859 A * 7/1997 Shiga ............... 174/17 VA
5,692,637 A * 12/1997 Hodge ............... 174/17 VA
6,095,568 A    8/2000 Fendt et al.
6,144,522 A * 11/2000 Myokan et al. ......... 360/97.02
6,506,110 B1 * 1/2003 Borisch ............... 174/17 VA

FOREIGN PATENT DOCUMENTS

| EP | 0 611 103 A2 | 8/1994 |
|---|---|---|
| EP | 0 860 923 A1 | 8/1998 |
| JP | 11-289171 A | 11/1989 |
| JP | 10-023636 A | 1/1998 |
| JP | 2000-114733 A | 4/2000 |
| JP | 2000114733 A * | 4/2000 |
| JP | 2002-134939 A | 5/2002 |

* cited by examiner

*Primary Examiner*—Angel R. Estrada
(74) *Attorney, Agent, or Firm*—Sughrue Mion, PLLC

(57) ABSTRACT

An Electronic Control Unit which houses electronic circuit for controlling various devices of vehicles in a sealing case is characterized in that the case has a ventilation hole to communicate an interior and an exterior of the case, the ventilation hole comprises a filter for preventing from entering contaminants from the outside, and a sectional area of the ventilation hole is gradually enlarged toward the interior of the case.

6 Claims, 10 Drawing Sheets

ELECTRONIC CONTROL UNIT

FIELD OF THE INVENTION

The present invention relates to an Electronic Control Unit (hereinafter referred to as the "ECU"), and more particularly to an improved ECU which is installed in an engine room et al.

BACKGROUND OF THE INVENTION

Generally, the ECU for controlling the driving of various devices such as an electric motor is mounted not only in the interior, but also in the exterior of a car. This ECU is constructed by a case (hereinafter referred to as the "ECU-case") for housing an electronic circuit (hereinafter referred to as the "ECU-circuit") constituted by electronic parts such as CPU. The ECU-case consists of an ECU-case body, ECU-case lid covering over the ECU-case body. Harnesses for transmitting various input or output signals, cables leading to power source, and grounded wires are connected to the ECU-circuit.

The ECU has a ventilation hole (a vent) in the ECU-case to regulate the pressure within the ECU-case so as to avoid an adverse effect by thermal expansion or contraction of the air within the ECU-case. For example, an opening for penetrating harness leading to the ECU-circuit is provided in the ECU-case. A waterproof grommet is mounted in the opening of the ECU-case to enhance the sealability of the ECU-case.

The ECU is provided not only inside the cabin of a car, but also outside the cabin thereof, for example, in various places such as engine room, trunk room, and the like. In case that the ECU is provided, for example, in an engine room, enter of water, dust, and the like into the ECU case may cause of a short circuit of the ECU-circuit. Thus, the ECU-case is subjected to be sealed by filling of the sealing materials such as adhesives in the mated surfaces between the ECU-case body and the ECU-case lid.

However, the filling of sealing materials and waterproof grommet is very difficult for the perfect sealing of the ECU-case because of the following reasons.

Where self-heating of various electronical parts occur within the ECU-case or temperature of the air within an engine room fluctuate (that is, air temperature increase or decrease), the change in temperature of the air within the ECU-case or the difference in pressure of the air within the ECU-case occur in the air between the interior and the exterior of the ECU-case.

Because of the difference in pressure of the air between the interior and exterior of the ECU-case, the contaminants such as water, dust, et al would be often sucked into the ECU-case through the clearance between the waterproof grommet and the harness or through the clearance between the coating of harness and the wire. The difference in pressure of the air between the interior and the exterior of the ECU-case causes the incompleteness of the sealing materials for filling up the clearance such as the mated surface between the ECU-case body and the ECU-case lid.

Therefore, various improvements for preventing contaminants such as water, dust, and the like from entering into the ECU-case would be done and disclosed in the conventional patent literatures.

As shown in FIG. 1, Japanese Patent Laid-Open Publication No. 23636/1998 discloses an ECU constructed by double-hull structure, which the ECU-case body 101 is divided into an inner case 102 and an outer case 103 surrounding the inner case 102. The ECU-case lid 104 is mounted on the ECU-case body 101. The clearance of the mated surfaces between the ECU-case body 101 and the ECU-case lid 104 is sealed by packing and the like. The ECU-circuit is housed in the inner case 102 to be connected by a harness 105. The harness 105 connects the ECU-circuit provided in the inner case 102 through waterproof grommets 106 to the outside device. The waterproof grommets 106 are mounted in the inner case 102 and the outer case 103.

Thus, the waterproof grommet 106 is able to prevent contaminants such as water, dust, and the like from entering into the ECU-circuit in the inner case 102 because the contaminants pass through the waterproof grommet 106 to enter into the ECU-circuit within the ECU-case 102 twice.

However, Japanese Patent Laid-Open Publication No. 23636/1998 has a drawback on the ground that the ECU becomes large in size, difficult in assemblage, and costs too much in manufacturing, because of the double-hull structure of the ECU comprising the inner case 102 and the outer case 103.

As shown in FIG. 2, Japanese Patent Laid-Open Publication No. 289171/1999 discloses an ECU-case 111 manufactured by the plastics-injection mold and an earth (ground) bus-bar 112 embedded into the ECU-case 111 at the time of being injection-molded. The earth (ground) bus-bar 112 is constructed to form a pair of conductive contacts 112a, 112b for projecting inwards or outwards from the ECU-case 111, respectively. As a path between the conductive contacts 112a, 112b is formed to be electrically conductive in the earth (ground) bus-bar 112, the both conductive contacts 112a, 112b are in an electrical conduction each other. Therefore, as the earth (ground) bus-bar 112 is integrally embedded into the ECU-case 111, the clearance for harness connecting between the interior and the exterior of the ECU-case 111 does not exist and the sealing of the clearance therebetween is not required.

An ECU-circuit housed in the ECU-case 111 is connected through a grounded wire to an inner portion of the earth (ground) bus-bar 112a projecting inside the ECU-case 111, and an outer portion of the earth (ground) bus-bar 112b projecting outside the ECU-case 111 is connected through a grounded wire to an external earth (ground). Thus, a path between the ECU-circuit and the external earth (ground) has a good electrical conduction through the earth (ground) bus-bar 112. Therefore, to apply the earth (ground) bus-bar's method instead of the other harness-connection method, waterproof grommets are not required so as to prevent contaminants such as water, dust, and the like from entering into the ECU-case 111.

However, a plurality of conductive contacts, which are mutually insulated, like an earth (ground) bus-bar are required to apply this method to every harness. Thus, it has a drawback on the ground that the ECU-case becomes large. It has also a drawback on the ground that there is few freedom as for the layout of the ECU-circuit and the installation of the harness, as a position for mounting the conductive contacts projecting inside or ouside the ECU-case must be restricted by a extremely severe requirement. Further, it has a drawback on the ground that the difference in pressure between the interior and the exterior of the ECU-case causes to be the entry of water through the clearance between harness' coating and wire, and to be the breaks of sealing for the clearance of the ECU-case.

As shown in FIG. 3, Japanese Patent Laid-Open Publication No. 134939/2002 discloses the ECU-case 120 in which the clearance between an ECU-case body 121 and an ECU-case cover 122 is constructed to be sealed by filling of adhesives 123. The ECU-case 120 has a cylindrical boss 124 to form a ventilation hole 125 therein. A filter unit is mounted on top of the cylindrical boss 124 to cover the ventilation hole 125.

This filter unit is constructed by a rubber-made inner pipe 126, a fiber-made filter film 127, and a plastic barrier cap 128. The cylindrical boss 124 and the inner pipe 126 are lapped one over the other and a path 129 is formed between the inner pipe 126 and the barrier cap 128. Numeral 130 shows a connector.

In the above ECU-case 120, ventilation air can mutually communicate through a passage for communicating the interior and the exterior of the ECU-case 120, which leads from the ventilation hole 125 through fiber-made filter film 127 to the path 129. Thus, even if the changes in temperature occur in the air within the ECU-case 120, the contaminants such as water, dust, and the like would not be sucked into the ECU-case 120, as there is no differenece in pressure between the interior and the exterior of the ECU-case 120. That is, the filter unit can prevent the contaminants from entering into the ECU-case 120.

However, the filter unit is complicated in structure and the device is large in size, thus the ECU case 120 has a drawback for higher manufacturing costs.

Japanese Patent Laid-Open Publication No. 353675/2002 discloses the same ventilation system as the ECU disclosed in Japanese Patent Laid-Open Publication No. 134939/2002, but they are different from the position for mounting the ECU.

The filter unit in the Japanese Patent Laid-Open Publication No. 353675/2002 is mounted in the vicinity of electronic parts formed of exothermic element such as power transistor. Thus, it has a specific effect that the difference in temperature and pressure of the air between the interior and the exterior of the ECU-case would make it smaller, and the contaminants such as water, dust, and the like are effectively prevented from entering into the ECU-case.

However, the filter unit is complicated in structure and costs too much in manufacturing as well as Japanese Patent Laid-Open Publication No. 134939/2002. Therefore, although the ECU discloses the protective art against the invasion of contaminants such as water, dust, and the like therein, the ECU has some drawbacks.

SUMMARY OF THE INVENTION

As above described, the ventilation structure of the conventional ECU has a drawback that it is complicated in structure, large in size, and costs too much. That is, the conventional ECU-case is subjected to be constructed by a double-hull structure, to have an earth (ground) bus-bar embedded into a plastics-molded ECU-case, and to have a complicated filter-unit structure, and the like.

The present invention has been achieved under these circumstances, and an object of the present invention is to provide an ECU which can prevent clogging of a ventilation hole and a filter to improve ventilation efficiency, and which is simple in structure and lower in cost.

The object of the present invention is attained by providing an ECU which has a ventilation section so as to reduce the difference in temperature and pressure between the interior and the exterior of the ECU-case, and the ventilation section is simple in structure and low-cost. That is, the above object is attained by an ECU which houses electronic circuit for controlling various devices of vehicles in a sealing case characterized in that the case has a ventilation hole to communicate an interior and an exterior of the ECU-case, the ventilation hole comprises a filter for preventing from entering contaminants from the outside, and a sectional area of the ventilation hole is gradually enlarged toward the interior of the ECU-case.

In addition, the above object is effectively attained by that the ventilation hole is of a tapered shape such that a cross section of the hole is gradually enlarged toward the interior of the ECU-case.

Further, the above object is effectively attained by that the ventilation hole comprises a barrier room provided in the exterior of the ECU-case, the barrier room having a small hole for communicating the interior and the exterior of the ECU-case with each other.

Furthermore, the above object is effectively attained by that the small hole of the barrier room comprises at least one small hole or slit for communicating between the interior and the exterior of the ECU-case with each other.

Still Furthermore, the above object is effectively attained by that the small hole of the barrier room is provided with a barrier net having at least one small hole or slit for communicating between the interior and the exterior of the ECU-case with each other.

Still Furthermore, the above object is more effectively attained by that the ECU comprises a ventilation hole which communicates the interior and the exterior of the ECU-case with each other, so as to reduce the pressure difference between the interior and the exterior of the ECU-case resulting from an increase of temperature or pressure within the ECU-case due to a self-heating element.

In addition, the above object is attained by an electric power steering system using the above ECU.

According to the ECU of the present invention, the ventilation hole which communicates the interior and the exterior of the ECU-case with each other is provided in the ECU-case, the filter is arranged in the ventilation hole formed in the ventilation section, and the sectional area of the ventilation hole is gradually enlarged toward the interior of the ECU-case, with an inlet of the ventilation hole narrowed. As a result, according to the present invention, a ventilation mechanism of the ECU can be realized by a simple structure. In addition, even if the ECU is disposed in an environment in which water relatively frequently splashes on the ECU such as in an engine room, and the temperature or the pressure within the ECU-case rises due to a self-heating element within the ECU, then it is possible to reduce the pressure difference between the interior and the exterior of the ECU-case, and prevent the contaminants such as water, dust, and the like from entering into the ECU-case.

Further, since the inlet of the ventilation hole is narrowed, it is possible to prevent contaminants such as water or dust from being directly hit against the filter from the outside. Even if such contaminants as water, salt water, or muddy water enter into the ventilation hole, an impact speed at which the contaminants is hit against the filter can be decreased and the filter can be prevented from being damaged, by gradually enlarging the sectional area of the ventilation hole toward the interior of the ECU-case. Besides, it is possible to prevent clogging of the filter caused by adhesion of the water, salt water, muddy water, or the like onto the filter, and prevent deterioration of filter function. Consequently, it is made difficult to damage the filter, thus improving durability of the filter.

DESCRIPTION OF REFERENCE SYMBOLS

Figure 1:
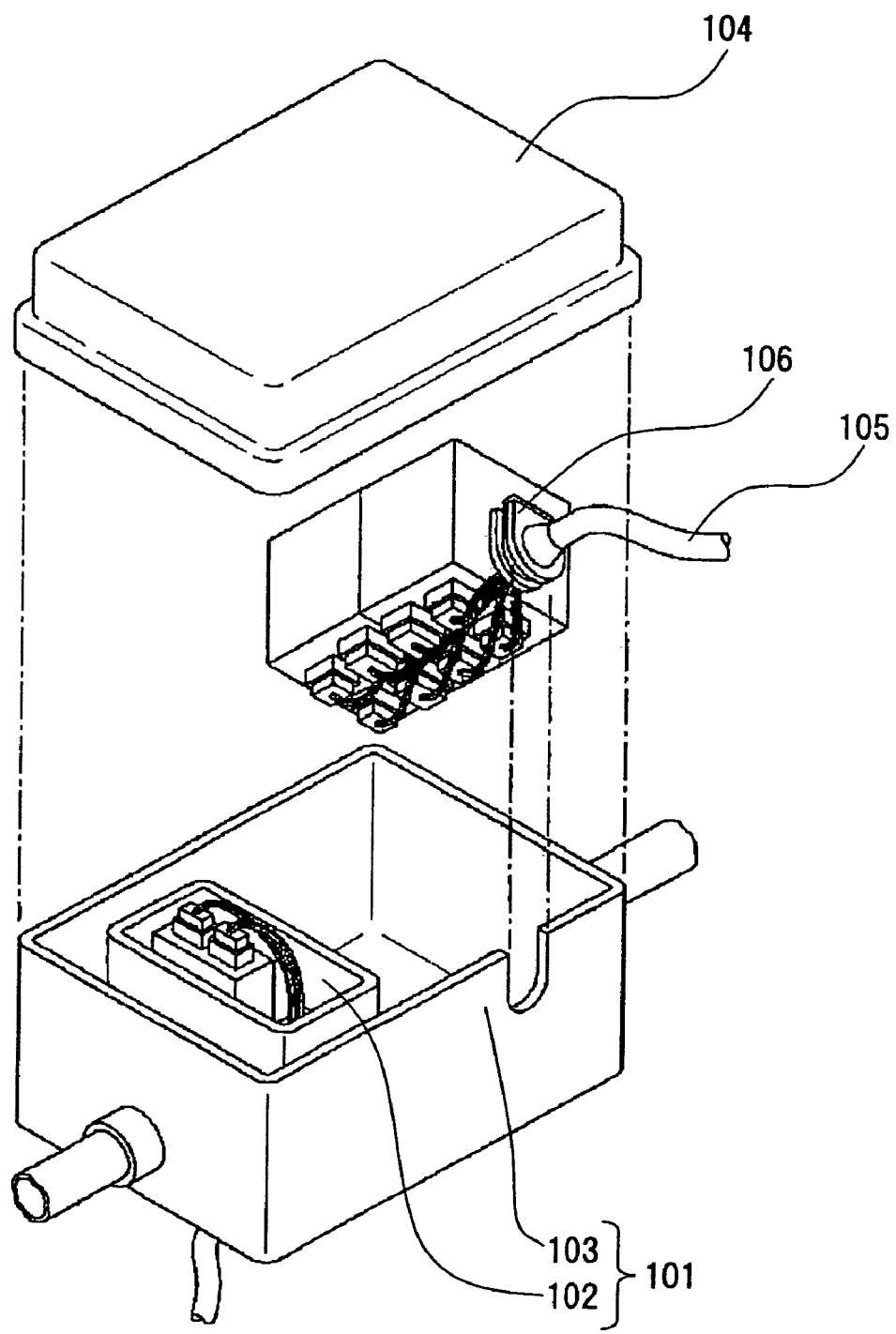
FIG. 1 is a perspective view which depicts case body and case lid of the case body consisting the conventional ECU case.
Figure 2:
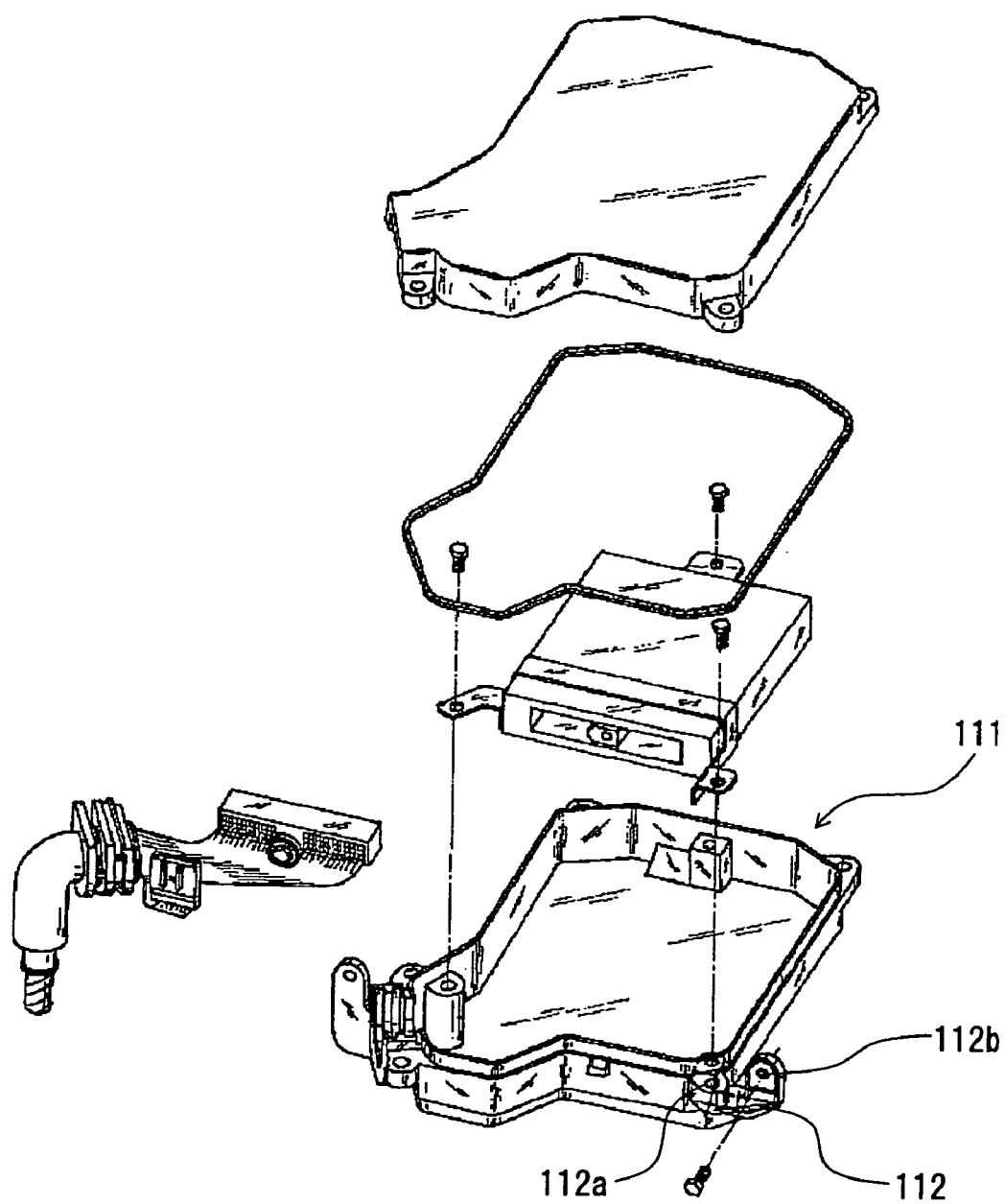
FIG. 2 is a perspective exploded view of the conventional ECU.
Figure 3:
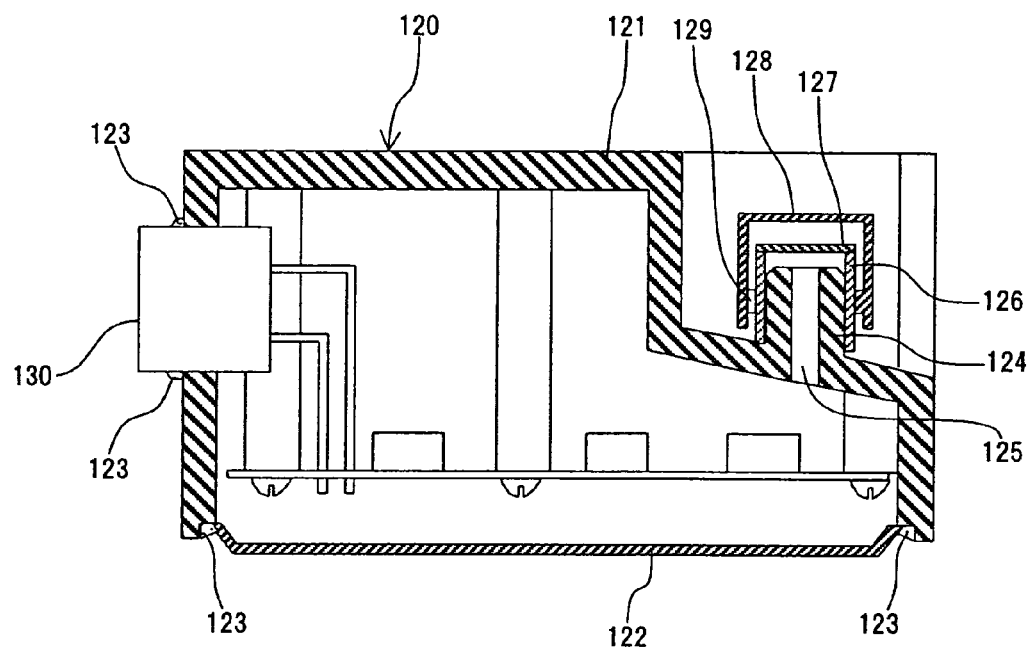
FIG. 3 is a cross-sectional view which depicts schematic structure of the conventional ECU.

2 ECU
3 ECU-case
5 ventilation section
6 ventilation hole
7 filter
8 barrier room
8a small hole
10 barrier net
11 barrier room
11a protrusion
12 slit

DESCRIPTION OF THE PREFERRED EMBODIMENTS

Embodiments of the present invention will be described hereinafter with reference to the drawings.

(First Embodiment)

Figure 4:
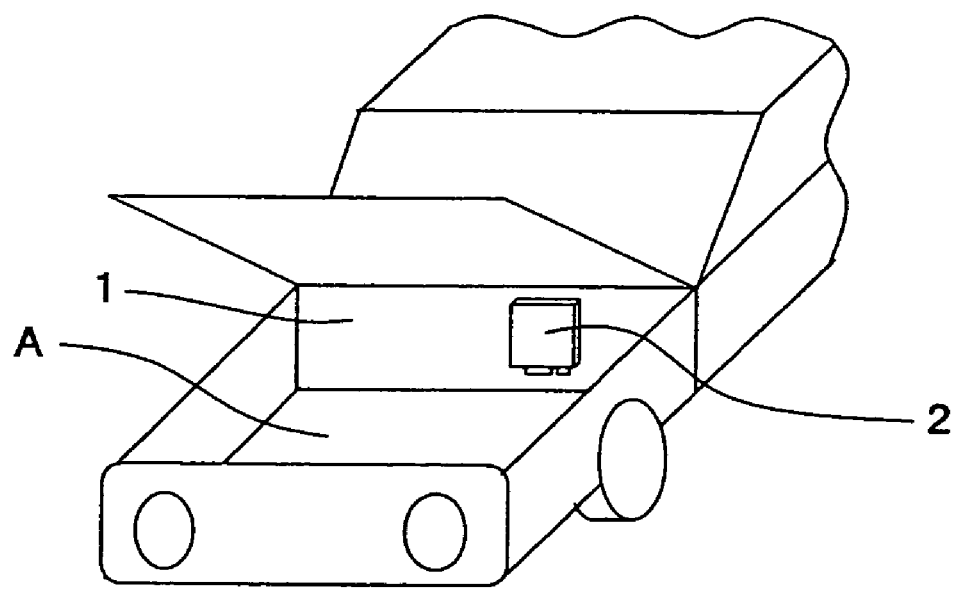
FIG. 4 depicts an attachment state of the ECU in the electric power steering system according to the first embodiment of the present invention.
Figure 5:
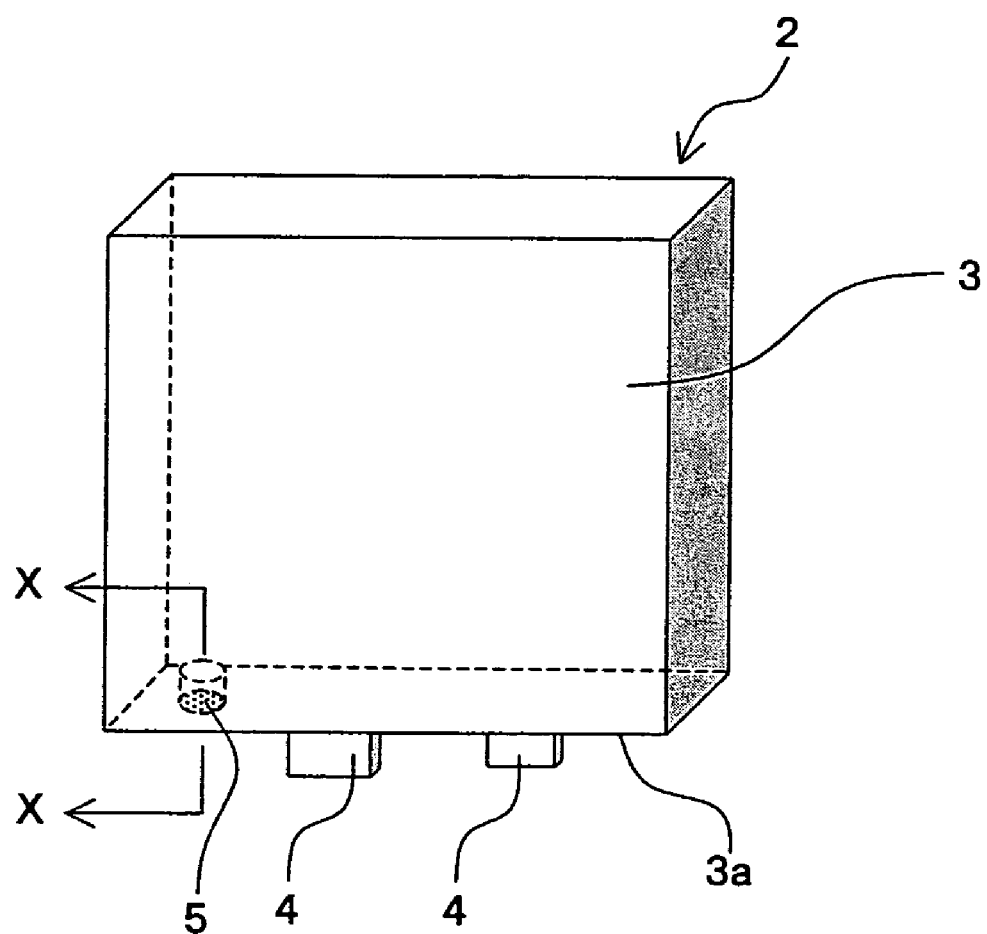
FIG. 5 is an external perspective view which depicts enlarged ECU.

FIG. 4 is a perspective view which depicts a front structure of an automobile. In an engine room A, an ECU 2 is attached to a partition 1 of the engine room A from a cabin. As enlarged and shown in FIG. 5 in detail, this ECU 2 is constituted so that connectors 4, 4 are provided on a bottom of ECU-case 3a of an ECU-case 3 which stores electronic components such as a power transistor serving as a heating element and a microcomputer, and so that the connectors 4, 4 are connected with various sensors such as a torque sensor through a harness.

Figure 6:
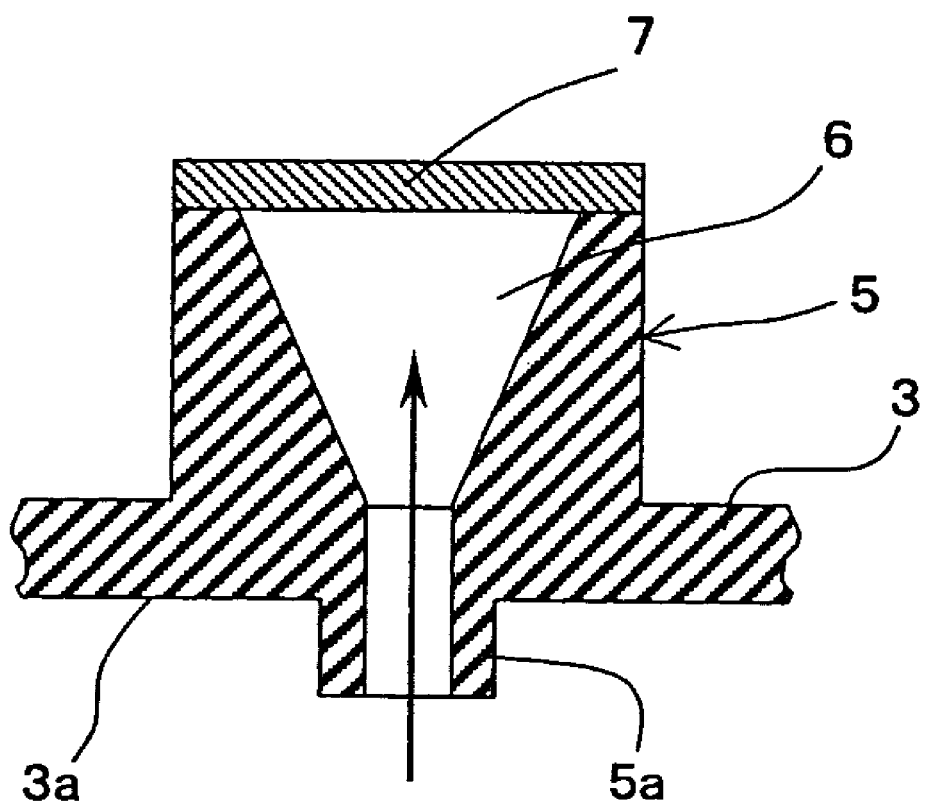
FIG. 6 is a cross-sectional view of the ventilation section taken along a line X—X of the FIG. 5.

A ventilation section (breathing section) 5 which communicates an interior and an exterior of the ECU-case 3 with each other is provided on the bottom of ECU-case 3. The ventilation section 5 reduces a pressure difference between the interior and the exterior of the ECU-case 3 resulting from a rapid increase of temperature or pressure of the air within the ECU-case 3. As shown in FIG. 6, this ventilation section 5 is formed integrally with the ECU-case 3, and formed into a cylinder extending inwards from the bottom of ECU-case 3a and opened on both ends, and has a cylindrical boss 5a protruding outwards.

A tapered ventilation hole 6 is formed in the ventilation section 5 so that a sectional area of the ventilation hole 6 is enlarged from the bottom of ECU-case 3a toward the interior of the ECU-case 3. A filter 7 consisting of a fiber material is attached to the interior of the ventilation hole 6 so as to prevent entry of water and dust. This filter 7, which is formed by a material that transmits only the air, e.g., a commercially and easily available material such as Gore Tex®, prevents water from entering into the ECU-case 3.

The ventilation hole 6 is formed so that an inlet of the ventilation hole 6 is narrowed by the cylindrical boss 5a protruding outwards from the ECU-case 3, and so that the sectional area is enlarged toward the interior of the ECU-case 3.

According to the above structure, it prevents contaminants such as water or dust (the contaminants include muddy water or salt water splashing cleaning water from the ground while a car is washed.) from entering into the ECU-case 3. The contaminants enter from the outside through a passage formed within the cylindrical boss 5a and the ventilation section 5, and the filter 7 into the ECU-case 3. Then, it prevents from entry of contaminants by enlarging a sectional area toward the interior of the ventilation section 5 so as to decrease progressive speed of the contaminants. Then, the contaminants enter at lower speed through the filter 7 into the ECU-case 3. It is thereby possible to prevent the contaminants being directly hit against the filter 7 from the outside.

In addition, by narrowing the inlet of the ventilation hole 6, it is possible to prevent high-pressure water from being directly hit against the filter 7 from the outside, to lessen an impact force, and to prevent filter 7 from being damaged by the impact of the high-pressure water, salt water, muddy water, or the like.

Besides, it is possible to prevent deterioration of a filter function due to adhesion of the water, salt water, muddy water or the like onto the filter 7, and prevent clogging of the filter 7. That is, the ventilation hole 6 is formed into a tapered shape, the sectional area of which is enlarged toward the interior of the ECU-case 3.

Therefore, an inflow speed, at which the contaminants hit against the filter 7 flows in from the ventilation hole 6, can be decreased, and an impact force of the contaminants against the filter 7 is reduced. Thus, this can makes it difficult to damage the filter 7 and improves the durability of the filter 7. As a result, even if the temperature or pressure within the ECU-case 3 is raised by a self-heating element stored in the ECU 2, the pressure difference between the interior and the exterior of the ECU-case 3 can be reduced or relieved. This is because the ventilation hole 6 communicates with the outside.

(Second Embodiment)

Figure 7:
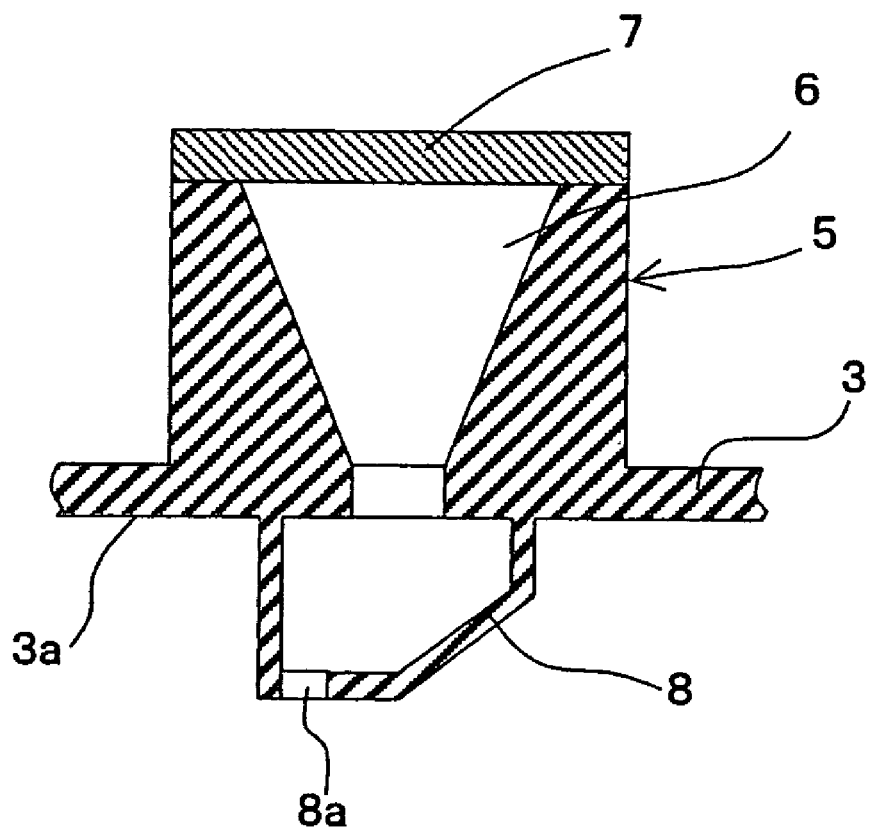
FIG. 7 is a cross-sectional view of the ventilation section corresponding to FIG. 6 which depicts the second embodiment of the present invention.

FIG. 7 depicts a second embodiment of the present invention. A ventilation section 5 is equal in structure to that according to the first embodiment. The ventilation section 5 comprises a tapered ventilation hole 6 so that a sectional area of the hole 6 is gradually enlarged toward an interior of an ECU-case 3, and a filter 7 is attached to the interior of the ventilation hole 6 so as to prevent entry of water, dust, or the like.

According to this second embodiment, a barrier room 8 is provided on the ECU-case 3 so as to cover an inlet of the ventilation hole 6, and a small hole 8a is formed in a part of the barrier room 8. As a result, even if water, dust, or the like enter into the ECU-case 3 from the outside, the contaminants stay within the barrier room 8. Therefore, it is possible to prevent the contaminants from directly entering into the ventilation hole 6, and decrease an entry speed of the contaminants. Hence, the second embodiment can exhibit the advantages indicating in the first embodiment more effectively.

(Third Embodiment)

Figure 8A:
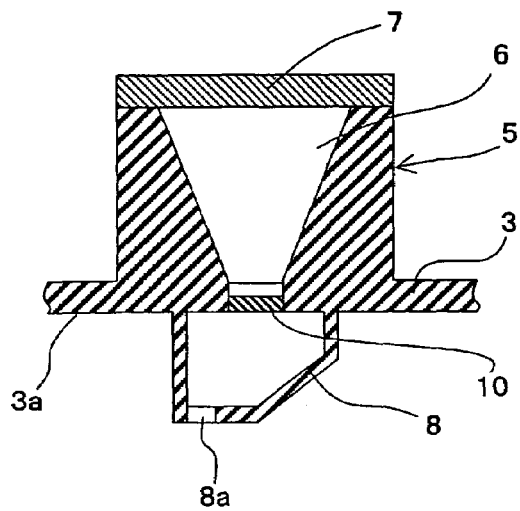
FIG. 8a is a cross-sectional view of the ventilation section corresponding to FIG. 6 which depicts the second embodiment of the present invention.
Figure 8B:
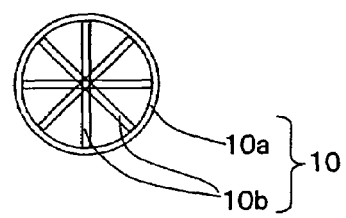
FIG. 8b is a plan view of the barrier net, and FIG. 8c to FIG. 8j is a plan view of the barrier net corresponding to FIG. 8b, respectively.
Figure 8C:
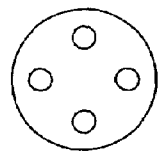
Figure 8D:
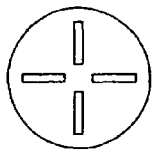
Figure 8E:
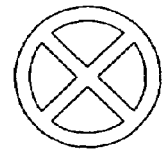
Figure 8F:
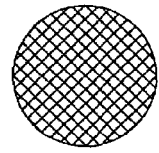
Figure 8G:
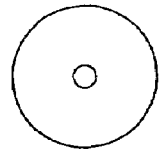
Figure 8H:
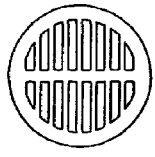
Figure 8I:
Figure 8J:
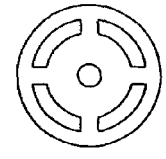

FIG. 8a depicts a third embodiment of the present invention. A ventilation section 5 is equal in structure to that according to the second embodiment. The ventilation section 5 comprises a tapered ventilation hole 6 so that a sectional area of the ventilation hole 6 is enlarged toward an interior of an ECU-case 3. In addition, a filter 7 is attached to the interior of the ventilation hole 6, a barrier room 8 is provided on the exterior of the ventilation hole 6 so as to cover an inlet of the ventilation hole 6, and a small hole 8a is formed in a part of the barrier room 8.

According to the third embodiment, a circular small hole is formed at the exterior of the ventilation hole 6, and a barrier net 10 composed of an annular member 10a fitted and inserted into the small hole and a shield rod 10b radially extending from a center of the small hole is arranged on the exterior of the ventilation hole 6. It is thereby possible to prevent the contaminants such as relatively large mud or dust from entering into the ECU-case 3 when water, dust or the like is to enter into the ECU-case 3 from the outside. Hence, the third embodiment can far more effectively exhibit the advantages indicating in the first and the second embodiments.

In addition, the barrier net 10 may be in a variety of shapes, e.g. shapes shown in FIG. 8c to FIG. 8j. In short, any shape to be easily manufacured may be used as the barrier net 10, only if the hole or the slit formed in the barrier net 10 provides ventilation function.

(Fourth Embodiment)

Figure 9A:
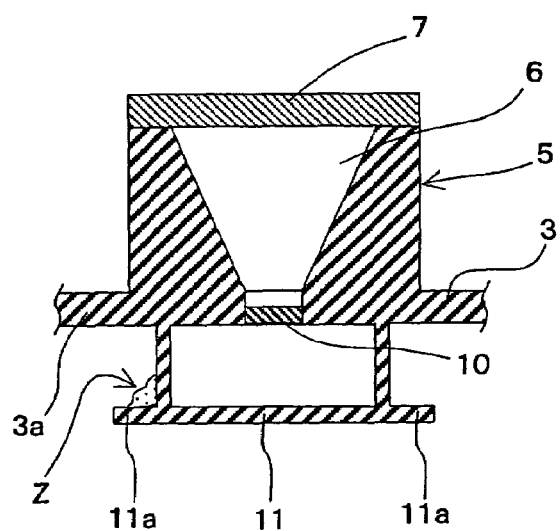
FIG. 9a is a cross-sectional view of the ventilation section corresponding to FIG. 6 which shows the fourth embodiment of the present invention.

FIG. 9a depicts a fourth embodiment of the present invention. A ventilation section 5 is equal in structure to that according to the third embodiment. The ventilation section 5 comprises a tapered ventilation hole 6 so that a sectional area of the hole 6 is enlarged toward the interior of an ECU-case 3, and a filter 7 is attached on top of the ventilation hole 6.

Figure 9B:
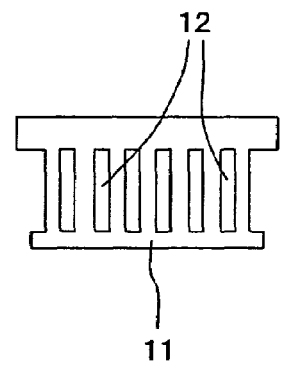
FIG. 9b is a side view of the barrier room.

As shown in FIG. 9b, a barrier room 11 is provided on an exterior of the ECU-case 3 so as to cover an inlet of the ventilation hole 6, and the barrier room 11 has a plurality of slits 12 formed along a peripheral side surface. It is thereby possible to prevent the contaminants such as relatively large mud or dust from entering into the ECU-case 3, when water, dust and the like is to enter into the ECU-case 3 from the outside. Hence, the fourth embodiment can far more effectively exhibit the advantages indicated in the first, the second, and the third embodiments.

Figure 9C:
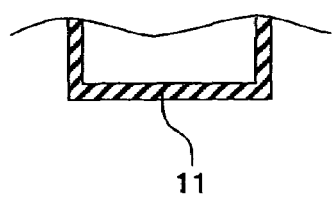
FIG. 9c is a partially cut cross-sectional view which depicts a modification of the barrier room.
Figure 9D:
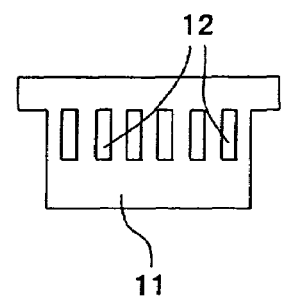
FIG. 9d is a side view which depicts a modification of the barrier room shown in FIG. 9c.

In the barrier room 11, the contaminants such as the water or mud may possibly be deposited at a position Z shown in FIG. 9a. Therefore, as shown in FIG. 9c, protrusion 11a in a lowest portion of the barrier room 11 (lower side in FIG. 9a) may be eliminated, whereby the deposition of the contaminants can be prevented. According to this modification, the same advantage as that of the fourth embodiment can be obtained. The opening area of the barrier room 11 becomes large, when the slits 12 are provided as shown in FIG. 9b. While, where the opening area of the slits 12 is smaller as shown in FIG. 9d, it is possible to more effectively prevent the contaminants from entering through the slits 12 into the ventilation hole 6. According to this modification, the same advantage as that of the fourth embodiment can be obtained.

Figure 10:
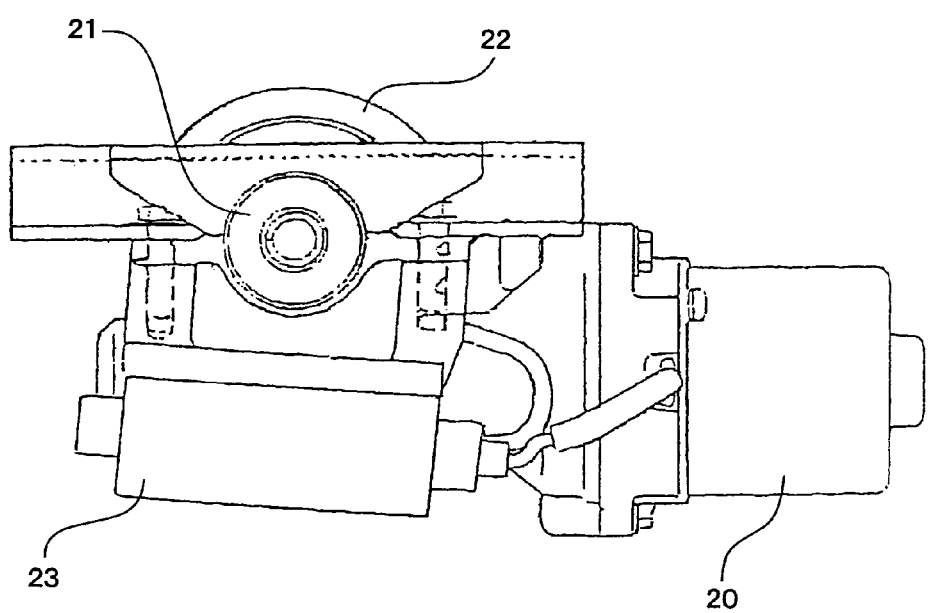
FIG. 10 depicts a state in which the ECU of the electric power steering system according to the present invention is attached to the gearbox.

FIG. 10 depicts a gearbox 22 which stores a deceleration unit which decelerates a rotative speed from an electric motor 20, and which transmits the decelerated rotation to a steering shaft 21, and depicts a state in which an ECU 23 is attached to the gearbox. As can be seen, even if an attachment position of the ECU 23 is restricted, the same function and advantage as those of the respective embodiment can be attained only by constituting a ventilation hole which communicates an interior and an the exterior of the ECU 23 with each other as described in the respective embodiment.

Therefore, according to the ECU of this invention, a ventilation hole 6 for communicating an interior and an exterior of the ECU-case 3 is provided in the ECU-case 3. The sectional area of the ventilation hole 6 is gradually enlarged toward the interior of the ECU-case 3. Hence, according to the present invention, a ventilation system of the ECU 2 can be constructed in a simple structure. Even if the ECU 2 is provided in a place like an engine room to be under the condition subjected to water and the like, and the temperature and the pressure within the ECU-case 3 increase owing to self-heating element, it prevents water from sucking into the ECU-case 3 by relieving the pressure difference between the interior and the exterior of the ECU-case 3.

It prevents from impact of contaminants such as water, salt water, muddy water, dust, et al against the filter 7 from the outside. Even if the contaminants enter into the ventilation hole 6, as the speed and force of impact against the filter 7 reduces, it prevents from failures of the filter 7 by enlarging the sectional area of the ventilation hole 6 toward the interior of the ECU-case 3. Further, it prevents form clogging of the filter 7 caused by the adhesion of the contaminants against the filter 7. Thus, the filter 7 becomes sturdy and trouble-free so that the durability of filter improves remarkably.

Further, the ventilation hole 6 may be of a tapered shape, funnel (cone) shape, or pyramid shape as being gradually enlarged in sectional area toward the interior of the ECU-case 3 from the outside. Further, an outside opening for ventilating the ECU-case 3 is provided not at a cylindrical boss, but at a barrier room 11, thus to prevent from entering into the ECU-case effectively. At least one small hole or at least one narrow slit are provided in the barrier room 11 to communicate to the outside. A barrier net 10 is provided between the barrier room 11 and the ventilation hole 6, it prevents from entering water, dust, and the like effectively.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the claims.

What is claimed is:

1. An Electronic Control Unit which houses an electronic circuit for controlling various devices of vehicles in a sealing case characterized in that the case has a ventilation hole to communicate an interior and an exterior of the case, a sectional area of the ventilation hole is gradually enlarged toward the interior of the case, and the ventilation hole comprises:

a filter for preventing contaminants from entering from the outside; and a barrier room provided as integrated with the case in the exterior of the case surrounding said ventilation hole, the barrier room having a small hole for communicating between the interior and the exterior of the case with each other.

2. An Electronic Control Unit according to claim 1, characterized in that the small hole of the barrier room comprises at least one small hole or slit for communicating between the interior and the exterior of the case with each other.

3. An Electronic Control Unit according to claim 1, characterized in that the small hole of the barrier room is provided with a barrier net having at least one small hole or slit for communicating between the interior and the exterior of the case with each other.

4. An Electronic Control Unit according to claim 1, characterized in that the case comprises a ventilation hole which communicates the interior and the exterior of the case with each other, so as to reduce a pressure difference between the interior and the exterior of the case resulting from an increase of temperature or pressure within the case due to a self-heating element.

5. An electric power steering system using an Electronic Control Unit according to claim 1.

6. An Electronic Control Unit according to claim 1, characterized in that the ventilation hole is provided on the bottom of the case.

* * * * *